(12) United States Patent
Kitch

(10) Patent No.: US 6,501,180 B1
(45) Date of Patent: Dec. 31, 2002

(54) STRUCTURE AND METHOD FOR CONTROLLING COPPER DIFFUSION AND FOR UTILIZING LOW K MATERIALS FOR COPPER INTERCONNECTS IN INTEGRATED CIRCUIT STRUCTURES

(75) Inventor: Vassili Kitch, San Ramon, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/619,351

(22) Filed: Jul. 19, 2000

Related U.S. Application Data

(62) Division of application No. 09/491,250, filed on Jul. 26, 2000, now Pat. No. 6,143,641.

(51) Int. Cl.[7] .............................................. H01L 21/88
(52) U.S. Cl. ...................................... 257/762; 438/622
(58) Field of Search ................................ 257/762, 763, 257/751; 438/622, 633, 634, 618

(56) References Cited

U.S. PATENT DOCUMENTS

| | | | | |
|---|---|---|---|---|
| 5,244,820 A | * | 9/1993 | Kamata et al. ................ 437/20 |
| 6,075,293 A | * | 6/2000 | Li et al. ...................... 257/763 |
| 6,100,195 A | * | 8/2000 | Chan et al. .................. 438/687 |
| 6,124,198 A | * | 9/2000 | Moslehi ....................... 438/622 |
| 6,147,402 A | * | 11/2000 | Joshi et al. .................. 257/751 |
| 6,150,723 A | * | 11/2000 | Harper et al. ............... 257/762 |
| 6,171,949 B1 | * | 1/2001 | You et al. .................... 438/633 |
| 6,181,012 B1 | * | 1/2001 | Edelstein et al. ........... 257/762 |
| 6,197,688 B1 | * | 3/2001 | Simpson ...................... 438/678 |
| 6,211,570 B1 | * | 4/2001 | Kakamu ....................... 257/760 |
| 6,232,230 B1 | * | 5/2001 | Iacoponi ..................... 438/687 |
| 6,242,808 B1 | * | 6/2001 | Shimizu et al. ............. 257/762 |
| 6,249,055 B1 | * | 6/2001 | Dubin ......................... 257/758 |

FOREIGN PATENT DOCUMENTS

JP        10229084 A   *   8/1998   ....... H01L/21/3205

\* cited by examiner

*Primary Examiner*—Caridad Everhart
*Assistant Examiner*—Renzo N. Rocchegiani
(74) *Attorney, Agent, or Firm*—Stallman & Pollock LLP

(57) ABSTRACT

In accordance with one embodiment of the invention, a diffusion barrier layer is formed in a copper interconnect structure by first forming a layer of intermetal dielectric material on an underlying layer of conductive material. A pattern of dual damascene structures is then formed in the interconnect dielectric layer. An adhesion layer is then formed on exposed sidewalls of the damascene structure and on the upper surface of the intermetal dielectric material. The adhesion-layer-lined dual damascene structures are then filled with a conductive material that includes copper. The copper-including conductive material is then planarized to the upper surface of the intermetal dielectric material. Intermetal dielectric material is then removed to expose the conductive material. A diffusion barrier material is then deposited on exposed surfaces of the conductive material. Low k dielectric material is then disposed over the entire interconnect structure to fill the gaps, thus providing a low k solution and structural integrity to the interconnect.

6 Claims, 3 Drawing Sheets

STRUCTURE AND METHOD FOR CONTROLLING COPPER DIFFUSION AND FOR UTILIZING LOW K MATERIALS FOR COPPER INTERCONNECTS IN INTEGRATED CIRCUIT STRUCTURES

This is a divisional of application Ser. No. 09/491,250, filed Jan. 26, 2000, now U.S. Pat. No. 6,143,641.

BACKGROUND OF THE INVENTION

1. Field of the Invention

The present invention relates to integrated circuit structures and to methods of their fabrication and, in particular, to integrated circuit fabrication techniques that prevent copper diffusion and permit the use of materials having a low dielectric constant (k) in copper interconnect structures.

2. Discussion of the Related Art

There are a number of issues associated with the utilization of copper interconnects in high density integrated circuits. For example, copper has a high diffusivity in oxide and silicon, even at room temperature. If copper diffuses from the interconnect wiring into the underlying active electrical devices, then these devices can fail to operate. Therefore, suitable confinement of the copper in the interconnect wires and thus, protection of the electrical devices is imperative.

The standard industry approach for the utilization of copper interconnects is to use barrier metals such as titanium nitride (TiN), tantalum (Ta), tantalum nitride (TaN) and/or tungsten nitride (WN) to prevent copper diffusion from the wires. However, this is a challenging task because barrier metal deposition processes must provide conformal coverage of the dual damascene structures commonly used in today's device structures. Moreover, the diffusion properties of the barrier metal in high aspect ratio dual damascene structures must meet high performance criteria.

Also, the semiconductor integrated circuit industry is leaning toward integration of copper with low k dielectrics. This creates a new set of problems. Low k materials are unstable at high temperatures. It is difficult to etch dual damascene structures in low k materials. Furthermore, selectivity of copper chemical mechanical polishing (CMP) to low k materials is poor.

Commonly-assigned U.S. patent application Ser. No. 09/295,898, filed Apr. 21, 1999, by Vassili Kitch and Michael E. Thomas, titled "Self-Aligned Interconnect Using High Selectivity Metal Pillars and a Via Exclusion Mask", discloses a process for forming a via in a semiconductor device that uses a self-aligned metal pillar to connect conductive interconnect layers separated by a dielectric. The upper ha surface of the pillar comprises a conductive cap material, e.g., tungsten, that exhibits high selectivity, i.e. greater than 5:1, to the etch of the overlying metal interconnect structure. Since the overlying metal formed on the conductive cap is typically aluminum or another material having high selectivity to tungsten, etching of the conductive layer during its patterning will not etch the underlying tungsten cap in the event of misalignment. Application Ser. No. 09/295,898 is hereby incorporated by reference to provide additional background information regarding the present invention.

Commonly-assigned U.S. patent application Ser. No. 09/295,838, filed Apr. 21, 1999, by Vassili Kitch, titled "Self-Aligned Copper Interconnect Structure and Method of Manufacturing Same", discloses a process for forming a copper-based interconnect structure using via pillars. In accordance with one embodiment of the disclosed invention, a lower interconnect layer includes a conductive diffusion barrier layer, a first copper layer formed on the diffusion barrier layer and a conductive etch stop layer formed on the first copper layer. An upper layer of conductive material, e.g., copper or tungsten, is then formed on the etch stop layer. The metal stack is then etched. If the upper conductive layer is copper, then a conventional hardmask, e.g., thick silicon dioxide (SiO2), is used to etch the upper copper layer, the etch stop layer, the first copper layer and the lower diffusion barrier layer to define the patterned metal stack. If the upper conductive layer is tungsten, then the tungsten itself can serve as a hardmask. In this case, patterned photoresist is used to etch through the tungsten; then the remainder of the stack is etched using the patterned tungsten as the hardmask. Following definition of the metal stack, a thin layer of dielectric material, e.g., silicon oxynitride (SiON) or silicon nitride ($Si_3N_4$), having good barrier properties against copper diffusion, is then deposited as a coating over the patterned metal stack. First dielectric material is then deposited, filling the gaps between the coated metal stack. The structure is then planarized using chemical mechanical polishing (CMP), leaving the upper surface of the upper conductive layer exposed. The exposed surface of the upper conductive layer is then masked and etched to define conductive via pillars. The etch stop layer of the lower interconnect layer serves as an etch stop to the via pillar etch. The sidewall surfaces of the via pillars that were exposed during the via pillar etch are then again coated with the barrier dielectric material and the gaps between the coated via pillars are filled with dielectric material. The dielectric material is then planarized to expose the upper surface of the via pillars. An upper conductive layer, preferably copper-based, is then formed in electrical contact with the exposed upper surfaces of the via pillars. This completes the fabrication of two copper-based interconnect layers with conductive via pillars formed between the two interconnect layers. Application Ser. No. 09/295,838 is hereby incorporated by reference to provide additional background information regarding the present invention.

Commonly-assigned U.S. patent application Ser. No. 09/295,892, filed Apr. 21, 1999, by Kevin C. Brown, titled "Self-Aligned Copper Interconnect Architecture With Enhanced Copper Diffusion Barrier", discloses a process that provides self-aligned vias in a copper-based multi-level interconnect structure using a conformal, metal-like material, such as CVD titanium nitride or PVD tantalum nitride, as a copper diffusion barrier. In accordance with one embodiment of the disclosed invention, a lower conductive interconnect layer includes a diffusion barrier layer, a first copper-based layer formed on the diffusion barrier layer and an etch stop layer formed on the copper-based layer. A second copper-based layer is formed on the etch stop layer and an optional conductive antireflective diffusion barrier layer is formed on the second copper-based layer. The upper antireflective diffusion barrier layer is then patterned and etched and utilized as a conventional hardmask to etch the second copper-based layer, the etch stop layer, the first copper-based layer and the lower diffusion barrier layer to define the patterned metal stack. A thin layer of conformal metal-like material, e.g., CVD TiN or PVD TaN, having good barrier properties against copper diffusion is then deposited over the patterned stack. An isotropic spacer etched-back of the conformal conductive barrier material is then performed such that barrier material is removed from the horizontal surfaces, leaving conductive diffusion barrier material on vertical sidewalls of the patterned stack. First dielectric material is then deposited, filling the gaps between the patterned stack. The structure is then planarized, e.g., using chemical mechanical polishing (CMP), leaving the upper surface of the patterned antireflective diffusion barrier layer exposed. The exposed antireflective diffusion barrier layer is then masked and etched to define copper-based via pillars that have caps formed with a conductive antireflective material. The etch stop layer serves as an etch stop to the copper etch. If the copper via pillar etch is selective to the conductive barrier material, then, to avoid shorts between via pillars, the via pillar etch must be followed by an isotropic etch of the exposed conductive barrier material that is selective to copper. If the copper via pillar etch is not selective to the conductive barrier material, then exposed conductive barrier material will be removed by the copper etch and the process can proceed. Since the conductive diffusion barrier layer has now been removed wherever it was exposed by the copper etch, and since the exposed sidewalls of the via pillars are thus not now protected by a diffusion barrier, a layer of conformal diffusion barrier dielectric material, e.g., silicon nitride, is deposited over exposed surfaces. Following deposition of the conformal diffusion barrier dielectric material, gaps between the via pillars are filled with dielectric material. The dielectric material is then planaraized to expose the upper surface of the antireflective diffusion barrier material that caps the via pillars. An upper conductive layer is then formed in electrical contact with the exposed pillar caps. The upper conductive layer comprises a material having high selectivity to the material of the antireflective diffusion barrier layer. Therefore, etching of the upper conductive layer during its patterning will not etch the underlying via pillars in the event of mask misalignment. If an antireflective layer is not utilized on the copper via pillar layer, then a conventional hardmask, e.g. thick silicon dioxide, is used to pattern the metal stack. A hardmask is needed because a conventional photoresist mask will not survive the high temperatures needed to etch copper. Use of a conformal metal-like diffusion barrier material, such as CVD titanium nitride or PVD tantalum nitride, improves over use of other copper barrier diffusion materials, such as silicon oxynitride. Application Ser. No. 09/295,892 is hereby incorporated by reference to provide additional background information regarding the present invention.

SUMMARY OF THE INVENTION

The present invention provides a solution for the problems associated with copper diffusion and utilization of low k dielectric materials in copper interconnect structures. Moreover, it provides cost advantages since it eliminates the need for effective diffusion barriers at every interconnect level. The diffusion barrier and low k material are deposited only once, just prior to passivation.

In accordance with an embodiment of the invention, a diffusion barrier layer is formed in a copper interconnect structure by first forming a layer of intermetal dielectric material on an underlying layer of conductive material. A pattern of interconnect lines and dual damascene vias is then formed through the interconnect dielectric layer to expose surface regions of the conductive material. An adhesion layer is then formed on exposed sidewalls of the dual damascene structures and on the upper surface of the intermetal dielectric material. The adhesion-layer-lined damascene structures are then filled with a conductive material that includes copper. The copper-including conductive material is then planarized to the upper surface of the intermetal dielectric material. Intermetal dielectric material is then removed to expose the copper-including conductive material. A diffusion barrier material is then deposited on exposed surfaces of the copper-including conductive material. Low k dielectric material is then deposited on the exposed surfaces of the underlying conductive material providing a low k solution and structural integrity.

A better understanding of the features and advantages of the present invention will be obtained by reference to the following detailed description and accompanying drawings which set forth an illustrative embodiment in which the principles of the invention are utilized.

DETAILED DESCRIPTION OF THE INVENTION

FIGS. 1–8 illustrate a preferred method of forming a copper interconnect structure in an integrated circuit structure while avoiding problems associated with copper diffusion and the utilization of materials having a low dielectric constant (k).

Figure 1:
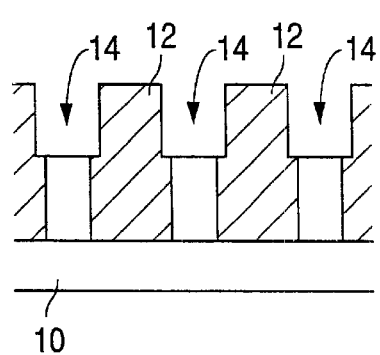
FIGS. 1–8 illustrate process steps for forming a copper interconnect structure in accordance with the concepts of the present invention.

Referring to FIG. 1, a process in accordance with the present invention begins with the formation of a layer of intermetal dielectric material 12, for example, conventional silicon dioxide ($SiO_2$) dielectric, on an underlying layer of conductive material 10, which can be conductive metal, such as copper or aluminum, or conductive polysilicon. A dual damascene structure 14 that includes vias is then formed in the intermetal dielectric material 12 in a conventional manner.

Figure 2:
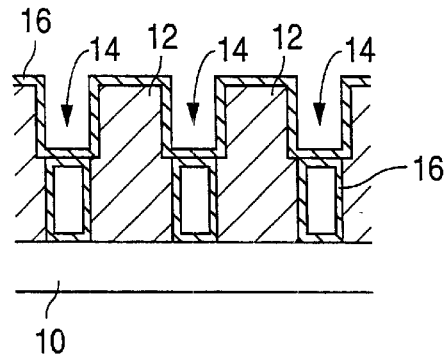

As shown in FIG. 2, following formation of the dual damascene structure 14, an adhesion layer 16 comprising, for example, titanium (Ti), titanium nitride (TiN) or tantalum (Ta), is formed on exposed sidewalls of the dual damascene via structure 14, on the upper surface of the intermetal dielectric material 12 and on exposed surface regions of the underlying conductive material 10. It is not necessary to be concerned about the diffusion barrier properties of the adhesion layer 16 during subsequent high temperature process steps. The resulting structure is shown in FIG. 2.

Figure 3:
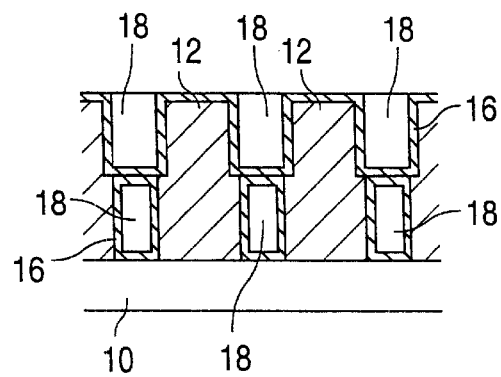

Next, as shown in FIG. 3, the adhesion-layer-lined dual damascene structure is filled with copper 18 utilizing conventional electroplating techniques and a chemical mechanical polishing (CMP) step is performed, stopping on the intermetal dielectric material 12.

Figure 4:
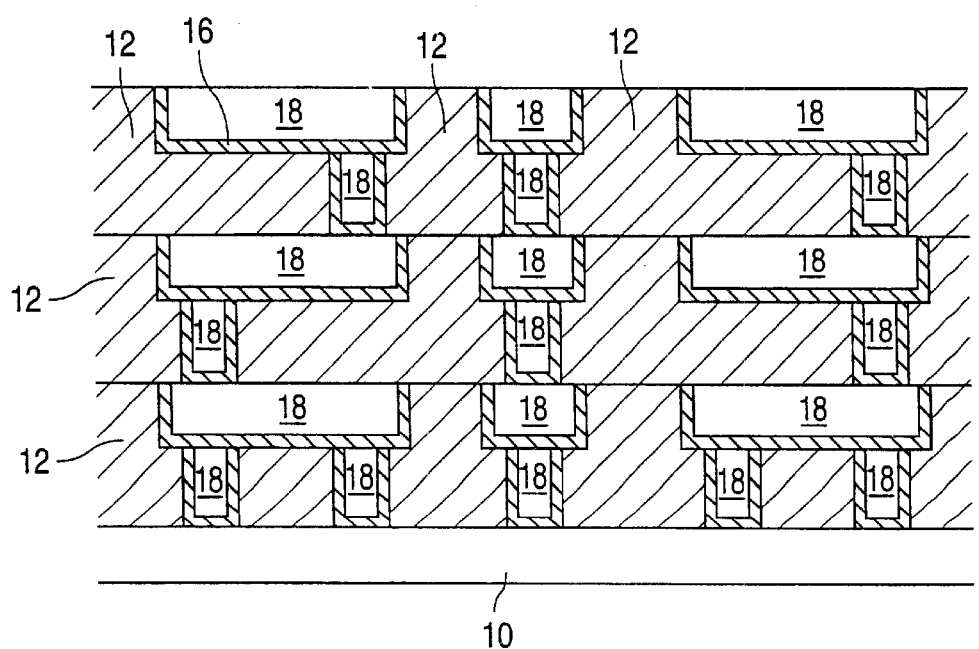

Those skilled in the art will appreciate that the foregoing steps may be repeated as many times as need for the desired copper interconnect structure 18, resulting, for example, in the structure shown in FIG. 4.

Figure 5:
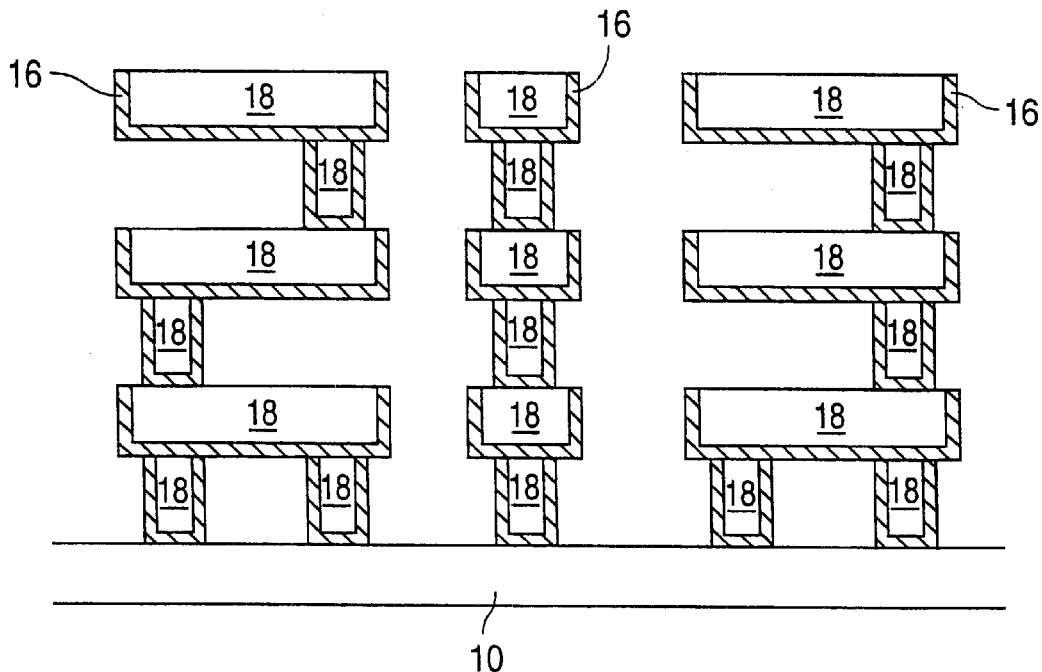
Figure 6:
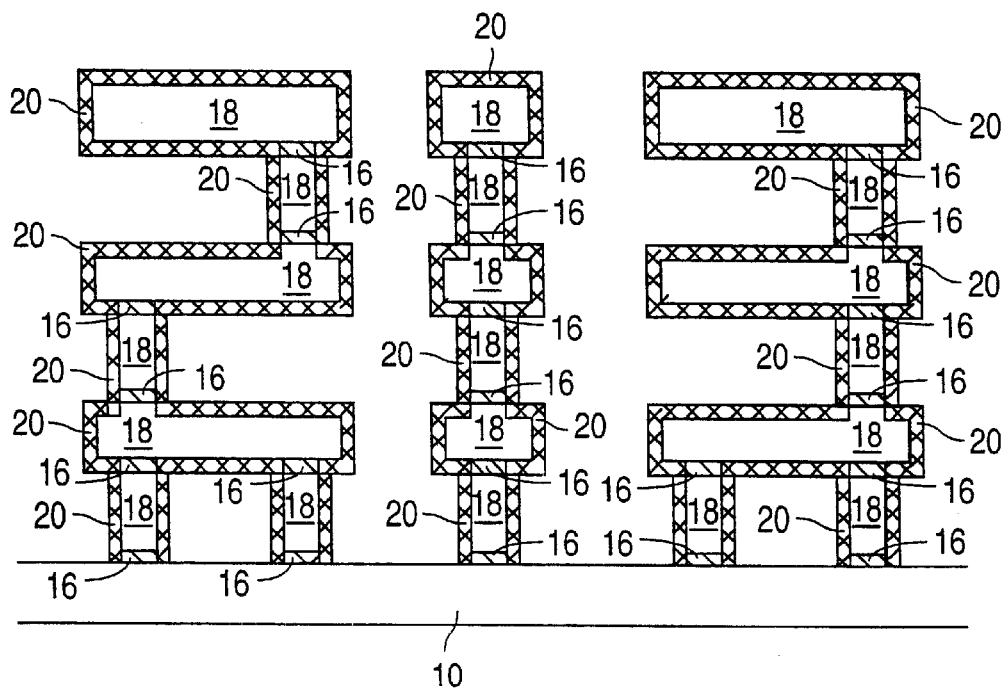

Referring to FIG. 5, after the copper interconnect structure 18 has been completed as described above, the intermetal dielectric material 12 is stripped, utilizing a conventional wet etch. Then, as shown in FIG. 6, a barrier metal 20 is selectively deposited. The metal 20 must be deposited only on metal lines 18. Deposition on the first dielectric layer is not allowed. This barrier metal 20 must have good barrier properties against copper diffusion. Applied Materials, Genus or other conventional equipment and processes may be used for selective deposition of tungsten (W) or tungsten nitride (WN), for example. A thin layer of silicon nitride may be used as an alternate to the metal barrier, using conventional nonselective deposition techniques.

Figure 7:
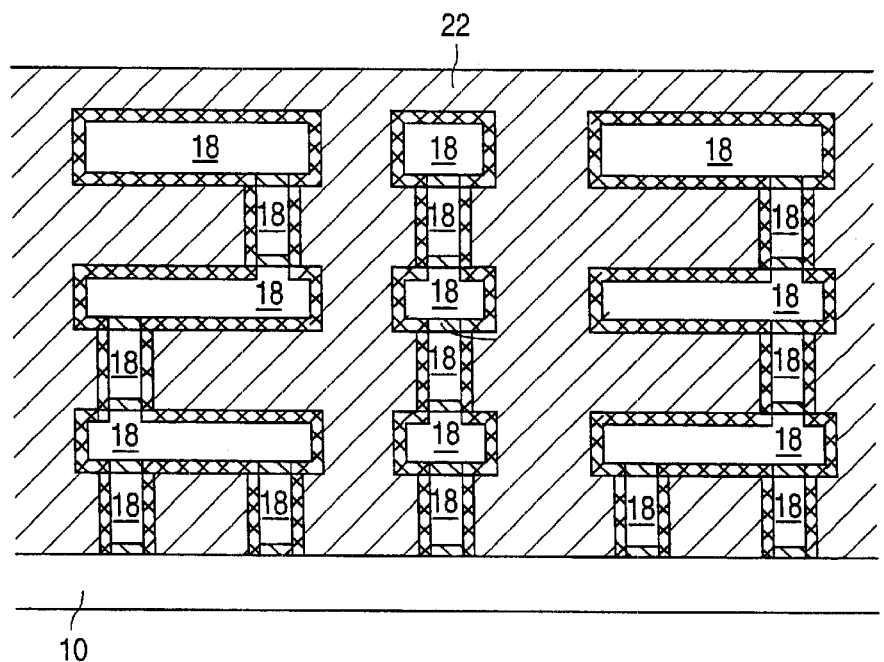

Next, as shown in FIG. 7, the entire interconnect structure is filled with a low k dielectric material 22 using spin on dielectric (SOD) processing, a void-free fill is not required; moreover, as discussed in commonly-assigned U.S. patent application Ser. No. 09/415,315, filed by Vassili Kitch, on Oct. 8, 1999, titled "Method for Formation of an Air Gap in an Integrated Circuit Structure," voids may actually improve the overall dielectric constant. Application Ser. No. 09/415,315 is hereby incorporated by reference to provide additional background information regarding the present invention. The low k dielectric material 22 is preferably an organic material having k in the range of about 2.0–3.5, e.g., materials such as SiLK, TRACE and BCD which are commercially available from Allied Signal Corp.

Figure 8:
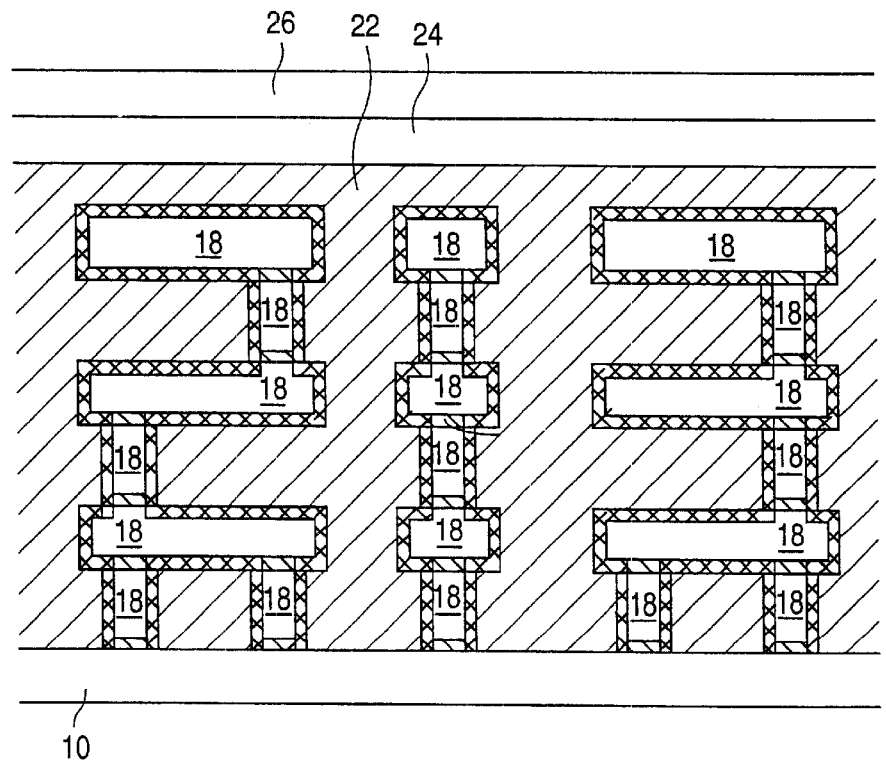

Finally, as shown in FIG. 8, the foregoing interconnect structure is passivated utilizing a conventional stack of silicon dioxide 24 and silicon nitride 26.

Various modifications and alterations in the structure and method of fabrication of this invention will be apparent to those skilled in the art without departing from the scope and spirit of the invention. Although the invention has been described in connection with a specific preferred embodiment, it should be understood that the invention as claimed should not be unduly limited to these embodiments. It is intended that the following claims define the scope of the invention and that structures and methods within the scope of these claims and their equivalents be covered thereby.

What is claimed is:

1. A copper-based interconnect structure formed as part of an integrated circuit structure, the interconnect structure comprising:

a plurality of patterned layers of copper-including conductive material formed over an underlying layer of conductive material, the patterned layers of copper-including conductive material being vertically disposed with respect to each other to define an interface area between adjacent patterned layers;

an adhesion material formed at interfaces between adjacent patterned layers of copper-including material;

diffusion barrier material formed on surfaces of the copper-including conductive material not having adhesion material formed thereon; and low k dielectric material formed in gaps between diffusion-barrier-coated copper-including conductive material.

2. The copper-based interconnect structure of claim 1, and further comprising:

a layer of passivation material formed over the low k dielectric material.

3. The copper-based interconnect structure of claim 2, and wherein the passivation layer comprises:

a layer of silicon oxide formed on the low k dielectric material; and a layer of silicon nitride formed on the silicon oxide layer.

4. The copper-based interconnect structure of claim 1, and wherein the adhesion material is selected from the group consisting of titanium, titanium nitride and tantalum.

5. The copper-based interconnect structure of claim 1, and wherein the diffusion barrier material is selected from the group consisting of tungsten and tungsten silicide.

6. The copper-based interconnect structure of claim 1, and wherein the diffusion barrier material comprises silicon nitride.

* * * * *